(12) United States Patent
Goodman et al.

(10) Patent No.: US 7,808,315 B2
(45) Date of Patent: Oct. 5, 2010

(54) CUBE COORDINATE SUBSPACES FOR NONLINEAR DIGITAL PREDISTORTION

(75) Inventors: Joel I. Goodman, Chelmsford, MA (US); Benjamin A. Miller, Allston, MA (US); Matthew A. Herman, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 159 days.

(21) Appl. No.: 12/154,669

(22) Filed: May 23, 2008

(65) Prior Publication Data

US 2009/0289706 A1 Nov. 26, 2009

(51) Int. Cl.
*H03F 1/26* (2006.01)

(52) U.S. Cl. ..................... 330/149

(58) Field of Classification Search .............. 330/149; 375/296; 455/114.1
See application file for complete search history.

(56) References Cited

U.S. PATENT DOCUMENTS

| 5,937,011 | A | 8/1999 | Carney et al. |
| 6,512,417 | B2 | 1/2003 | Booth et al. |
| 6,798,843 | B1 * | 9/2004 | Wright et al. ............ 330/149 |
| 6,903,604 | B2 * | 6/2005 | Kim .............................. 330/149 |
| 2008/0032642 | A1 | 2/2008 | Singerl et al. |

FOREIGN PATENT DOCUMENTS

EP 1 280 273 A2 1/2003
WO WO 2009/142683 A1 11/2009

OTHER PUBLICATIONS

Candes, et al., "The Dantzig Selector: Statistical Estimation When $p$ is much larger then $n$," Applied and Computational Mathematics, Department of Mathematics, University of California, Los Angeles, pp. 1-37, revised version (May 2005).

(Continued)

*Primary Examiner*—Khanh V Nguyen
(74) *Attorney, Agent, or Firm*—Hamilton, Brook, Smith & Reynolds, P.C.

(57) ABSTRACT

A method or corresponding apparatus relates to a mathematical approach to efficiently search for and localize regions in a multi-dimensional signal space to enable inversion of power amplifier nonlinearities with a significant reduction in computational complexity and an efficient hardware implementation. To linearize a wideband power amplifier, an example embodiment of the present invention may represent a response of the wideband power amplifier using coefficients in a cube coefficient subspace, and search over the full multi-dimensional subspace according to an optimization criterion in order to identify a vector of cube coefficient subspace coefficients. The vector of coefficient subspace coefficients may be used to linearize the wide-band power amplifier.

24 Claims, 7 Drawing Sheets

OTHER PUBLICATIONS

Kim, et al., Digital Predistortion Linearizes Wireless Power Amplifiers, *IEEE Microwave Magazine*, pp. 54-61 (Sep. 2005).

Malioutov, et al., "Homotopy Continuation for Sparse Signal Representation," *IEEE International Conference on Acoustics, Speech, and Signal Processing*, Philadelphia, PA, pp. V-733-736 vol. 5 (Mar. 2005).

Herman, M. et al., "The Cube Coefficient Subspace Architecture for Nonlinear Digital Predisposition," 42nd Asilomar Conference on Signals, Oct. 26, 2008, pp. 1857-1861, XP007909221.

Notification of Transmittal of the International Search Report for PCT Application No. PCT/US2009/002124, Date Mailed: Jul. 27, 2009.

Written Opinion of the Internation Searching Authority for PCT Application No. PCT/US2009/002124, Date Mailed: Jul. 27, 2009.

\* cited by examiner

CUBE COORDINATE SUBSPACES FOR NONLINEAR DIGITAL PREDISTORTION

GOVERNMENT SUPPORT

The invention was supported, in whole or in part, by contract number FA8721-05-C-0002 from the United States Air Force. The United States Government has certain rights in the invention.

BACKGROUND OF THE INVENTION

Power amplifiers are among the important components of most communication systems. Wireless communication systems typically employ power amplifiers to compensate for attenuation that occurs during transmission through a propagation medium. One design consideration is that the power amplifier itself may introduce distortion of the transmitted signal as well as lower signal-to-noise ratio levels. Spectral efficiency is also an important consideration in the design of communication systems. Modern second- and third-generation communication systems that have complex digital modulator technologies now demand that linearity also be treated as a critical performance requirement. Thus, both linearity and spectral efficiency are important performance requirements of power amplifiers.

Increasing linearity of a power amplifier is a challenging engineering problem and is usually achieved at the expense of power efficiency. Several techniques have been used to increase the linearity of power amplifiers. One approach, known as digital baseband predistortion, operates based on an adaptation of a function created from the desired modulation level and the power amplifier output.

One popular digital baseband predistortion technique is to use look-up tables to modify amplitude and phase values of the input to a power amplifier. It has been found that the performance of look-up table-based digital baseband predistortion decreases as the operating bandwidth of the power amplifier increases. Consequently, look-up table-based techniques suffer from poor performance in wideband applications.

Given its high computational complexity, digital baseband predistortion using standard polynomial signal processing is also not particularly well-suited to linearizing wideband power amplifiers. One reason for the high computational complexity is the inherent inefficiency of using a sufficiently deep memory and a high-enough polynomial order to span the multi-dimensional signal space needed to mitigate power amplifier-induced nonlinear distortion.

SUMMARY OF THE INVENTION

Since wideband power amplifiers are important for transmitting signals in military systems, wireless base stations, and cable television networks, it is desirable to develop a technique having low computational complexity for linearizing wideband power amplifiers.

A method or corresponding apparatus in an example embodiment of the present invention relates to a mathematical approach to efficiently search for and localize regions in the multi-dimensional signal space to enable inversion of power amplifier (PA) nonlinearities with a significant reduction in computational complexity.

In the view of the foregoing, the following description illustrates example embodiments and features that may be incorporated into a system for linearizing a wideband power amplifier, where the term "system" may be interpreted as a system, a subsystem, apparatus, method or any combination thereof, with regard to embodiments of the present invention.

In order to linearize a wideband power amplifier, the system may determine a response of the wideband power amplifier, represent the response using coefficients in a multi-dimensional coefficient space, and search over the multi-dimensional coefficient space in order to identify a vector of multi-dimensional subspace coefficients that may be used to linearize the response of the wide-band power amplifier.

The system may represent the response of the wideband power amplifier as a Volterra Series.

The system may employ components that span hypercubic and parallelepiped regions in the multi-dimensional coefficient space to represent the response of the power amplifier. The multi-dimensional coefficient subspaces may further be cube coefficient subspaces (CCS) or diagonal cube coordinate subspaces (CCS-D).

The system may use an optimization criterion that employs summation of one or more optimization criteria. The optimization criteria (there can be one or more criteria) may be obtained from a regularization term equal to a sum of norms of coefficients of each cube coefficient subspace component. Additionally, the one or more optimization criteria may be obtained from a norm of a difference between observed and estimated data.

The observed data may be obtained from a vector of input voltage levels to the power amplifier.

The estimated data may be obtained from a product of a kernel matrix and a CCS vector. The kernel matrix may be obtained from nonlinear combinations of voltage levels observed from digitizing an output of the power amplifier based on a predetermined vector of input voltage levels to the power amplifier.

The vector of multi-dimensional coefficients that nonlinearly filter the input to feed to the amplifier may be applied as a digital baseband pre-distortion filter.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

A method or corresponding apparatus in an example embodiment of the present invention relates to a mathematical approach to efficiently search for and localize regions in a multi-dimensional signal space to enable inversion of power amplifier nonlinearities with a significant reduction in computational complexity.

Figure 1:
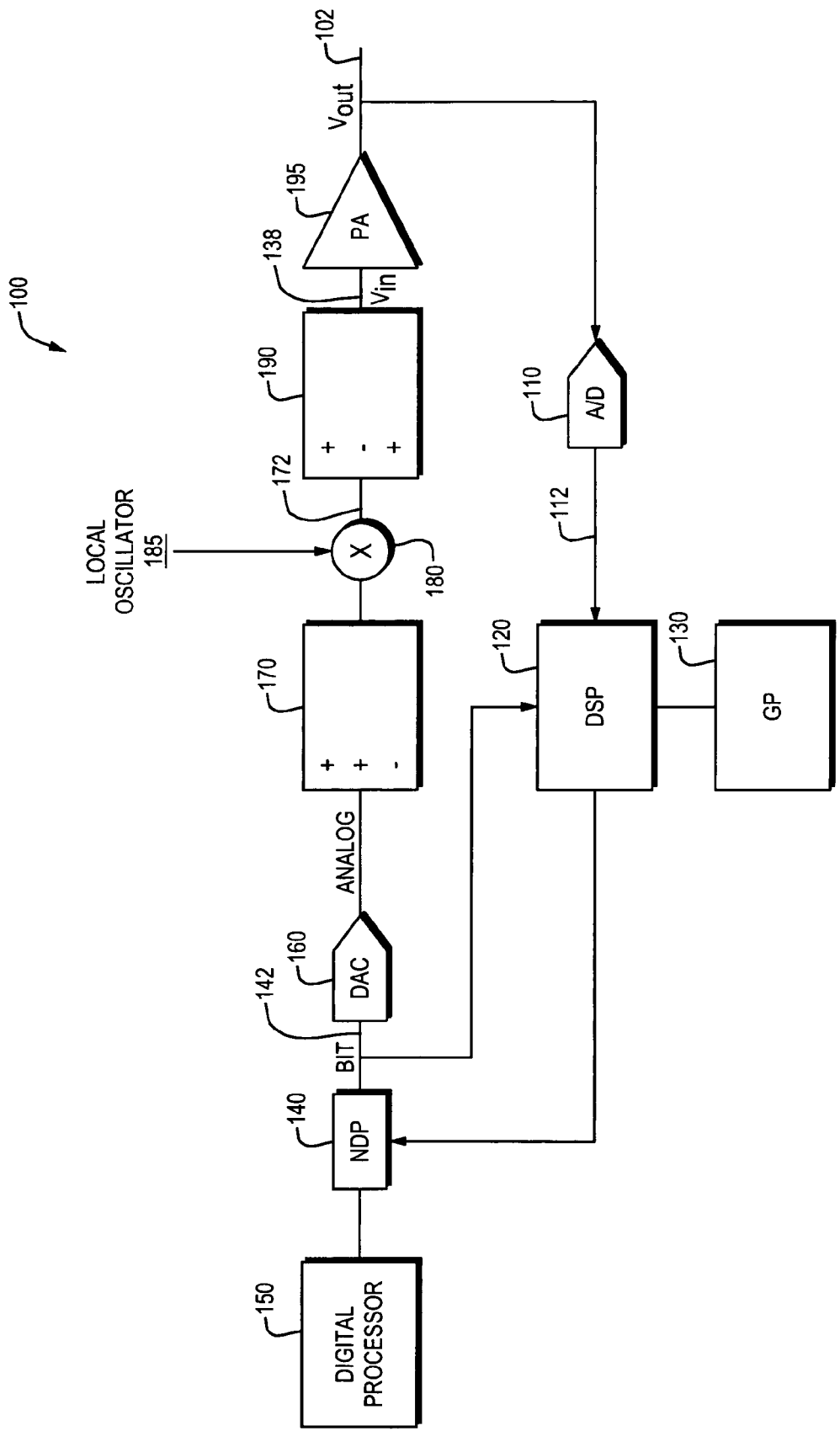
FIG. 1 illustrates an example transmitter structure for a nonlinear power amplifier.

FIG. 1 illustrates a block diagram of an example transmitter 100 that utilizes a power amplifier 195. The output 102 of the power amplifier 195 is transmitted to an analog to digital (A/D) converter 110, where the analog output 102 is converted to a stream of digital bits 112. The output 112 of the analog to digital converter 110 is then fed to a digital signal processor (DSP) 120 for further processing. An optional general purpose processor 130 may be employed. The general purpose processor 130 serves as an interface for the digital signal processor 120. The combination of the analog to digital converter 110 and the digital signal processor 120 is commonly referred to as an equalizer.

The output of the digital signal processor 120 is then fed to a nonlinear digital pre-distorter (NDP) 140 where pre-distortion is introduced. According to the description below, the nonlinear digital pre-distorter 140 receives an input signal to be amplified from a digital processor 150. The digital output 142 of the nonlinear digital pre-distorter 140 is then transmitted as a stream of bits 142 to a digital-to-analog converter (DAC) 160, where the digital signal is converted to analog and low-pass filtered 170. A second local oscillator 185 may be applied to a mixer 180 to control the center frequency of the analog signal 172. The analog signal 172 may further be processed using a band pass filter 190. The resulting signal 138, is fed as an input, $V_{in}$, to the power amplifier 195.

Figure 2:
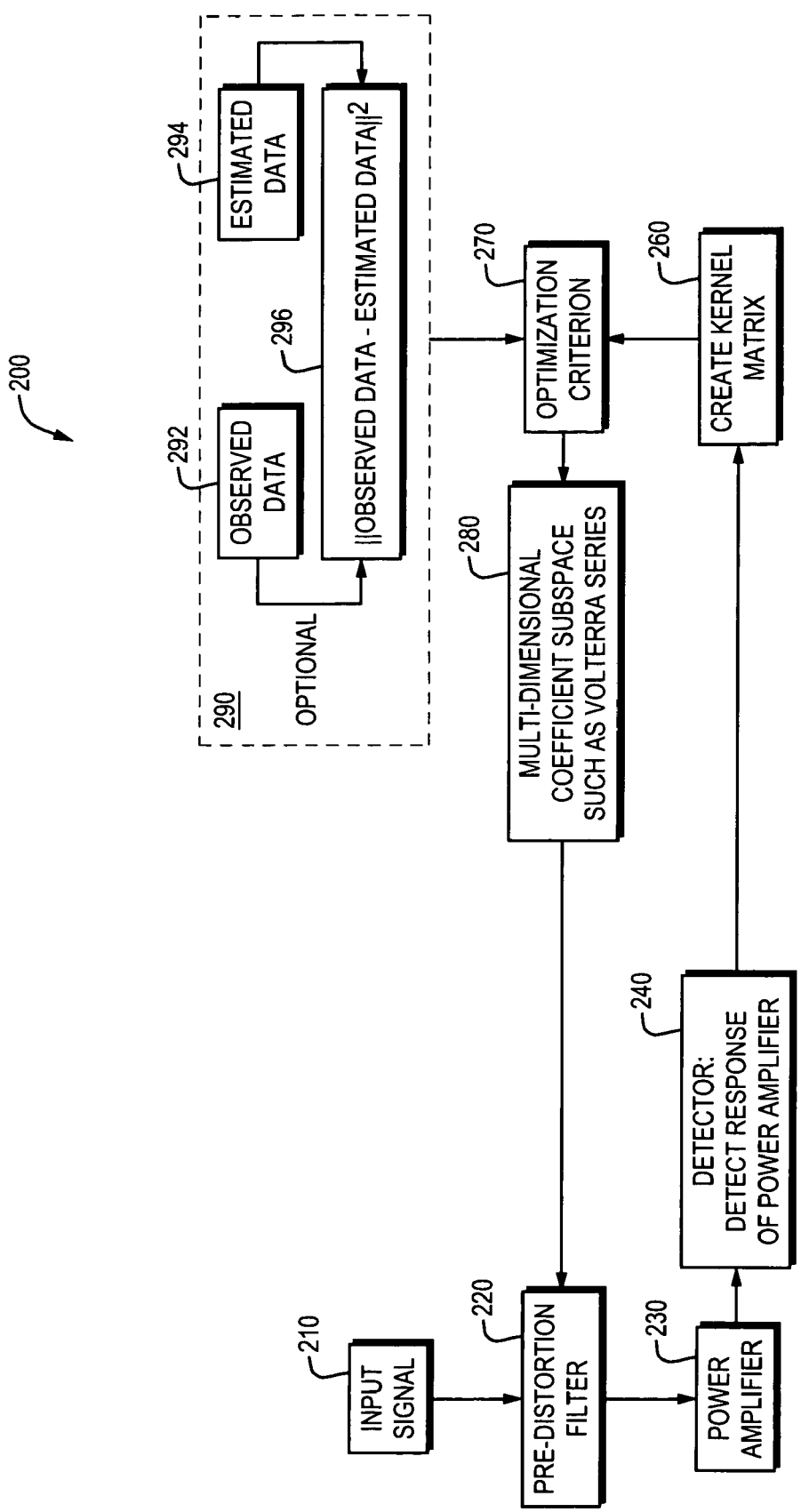
FIG. 2 is a detailed flow diagram of an example embodiment of the present invention.

FIG. 2 is a more detailed flow diagram 200 of an example embodiment of the predistorter. In this example embodiment, a pre-distortion filter 220 is employed to filter an input signal 210 that is fed to the power amplifier 230. The pre-distortion filter 220 may use a vector of multi-dimensional coefficients 280 to filter the input signal 210. Subsequently, a detector 240 detects the response of the wideband power amplifier 230. The response of the power amplifier 230 may be represented using a variety of multi-dimensional coordinate space coefficients, such as a Volterra Series 280. Subsequently, the example embodiment generates a kernel matrix 260 as a function of the response of the power amplifier, obtained from the detector 240, and an optimization criterion 270. The optimization criterion 270 may be obtained 290 by calculating a norm of a difference 296 between observed data 292 and estimated data 294.

To identify the coefficients along the system layout, an example embodiment of the present invention employs the quadratic programming formulation:

$$\hat{h} = \arg\min_{h} \|y - Xh\|_2^2 + \lambda \|\tilde{h}\|_1$$

where y is the output of the nonlinear predistorter system, x is the kernel matrix corresponding nonlinear combinations of the digitized output of the power amplifier, $h=[h_{ccs1}^T, \ldots, h_{ccsM}^T]^T$ is the vector of CCS and CCS-D coefficients, and $\|\cdot\|_2, \|\cdot\|_1$ correspond to the $L_2$ and $L_1$ norms, respectively. The components of the vector $\tilde{h}=[\|h_{ccs1}\|_2 \|h_{ccs2}\|_2 \ldots \|h_{ccsM}\|_2]$ are the $L_2$ norms of the coefficients that correspond to individual CCS and CCS-D components, while the regularization parameter $\gamma$ penalizes choosing too many CCS components when minimizing the least squares error.

Figure 3:
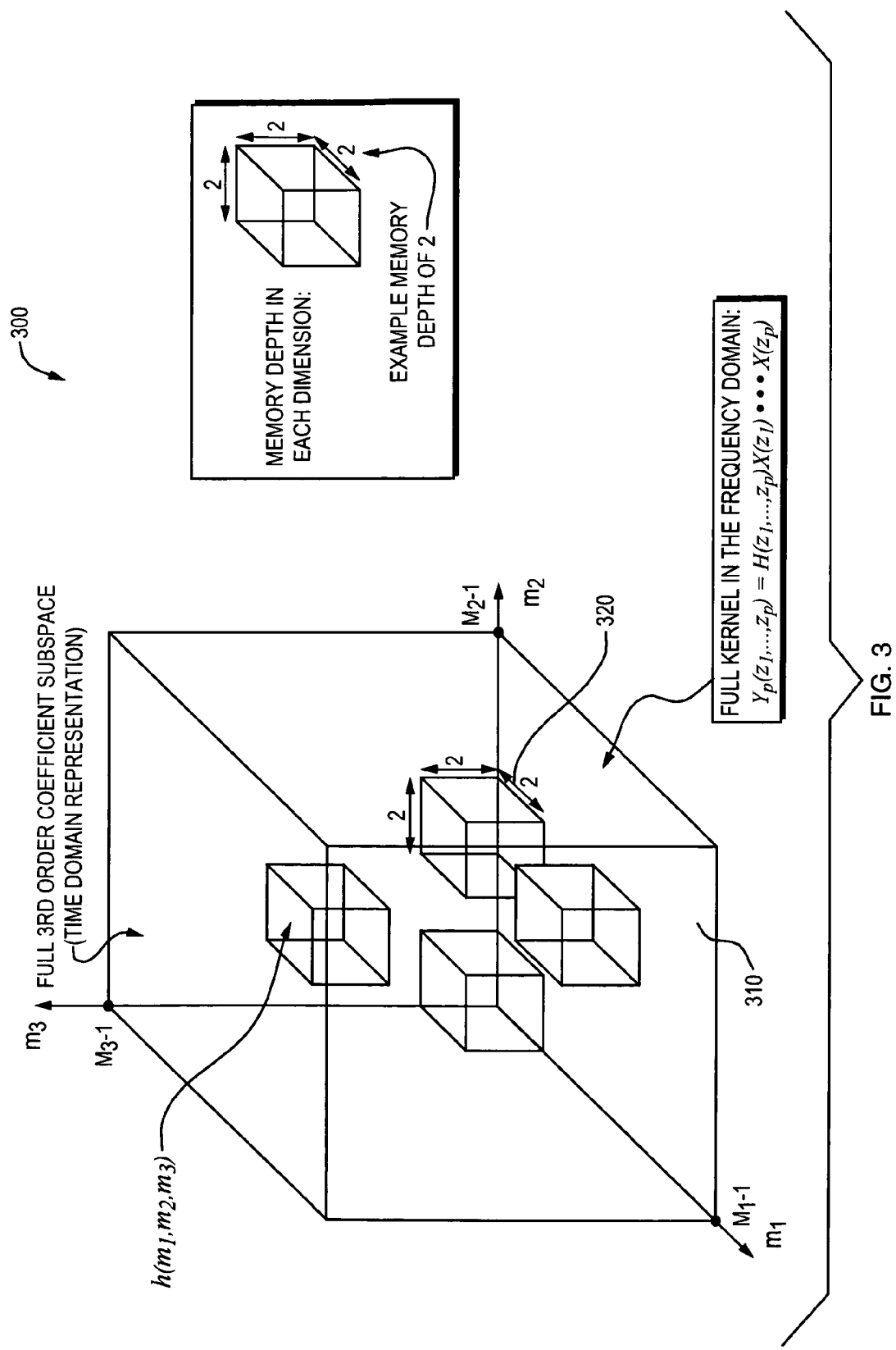
FIG. 3 illustrates a geometric interpretation of a CCS system.

FIG. 3 illustrates a geometric interpretation of a cube coefficient subspace (CCS). The response of the power amplifier, similar to any function, may be represented using a polynomial basis. In one example embodiment, the response of the power amplifier may be represented as a multi-dimensional coefficient space such as a Volterra series. As will be explained below in detail, rather than attempt to represent the whole multi-dimensional coefficient space as Volterra series, techniques of the preferred embodiment break that space into smaller subspaces.

In a preferred embodiment, the Volterra series representation of one nonlinear system representing the power amplifier may be broken into components of arbitrary size that span both horizontal and diagonal swaths in p-dimensional coefficient space. For example, in a three-dimensional coefficient space, the horizontal swaths form a CCS, expressed mathematically as $$y_5(n) = \sum_{m_1=delay_1}^{delay_1+memory} \sum_{m_2=delay_2}^{delay_2+memory} \sum_{m_3=delay_3}^{delay_3+memory} h\binom{m_1, m_2, m_3,}{\alpha_4, \alpha_5} x(n-m_1)x(n-m_2)$$
$$x^*(n-m_3)x(n-\alpha_4)x^*(n-\alpha_5)$$

where the delay values in the above summations allow each of the CCS components to span arbitrary locations in the multi-dimensional coefficient space, geometrically illustrated in FIG. 3. The CCS component formulated above corresponds to a fifth order polynomial, where x denotes the input to the device, $x(n-m_i)$ denotes the selection of input samples, $h(m_1, m_2, m_3, \alpha_4, \alpha_5)$ represents a multi-dimensional impulse function, and the $\alpha$ values represent signal delay elements. The above equation is effectively used to represent a right-hand inverse to the nonlinearities of the power amplifier response and also to model these nonlinearities.

As shown, the CCS component consists of small hypercubes of arbitrary dimension (in this example limited to three) within the full kernel 310. In the present example, a memory depth 320 has been limited to 2 samples in each dimension. The CCS architecture allows efficient adaptation in multiple dimensions beginning with the very first nonlinear component selected.

Figure 4:
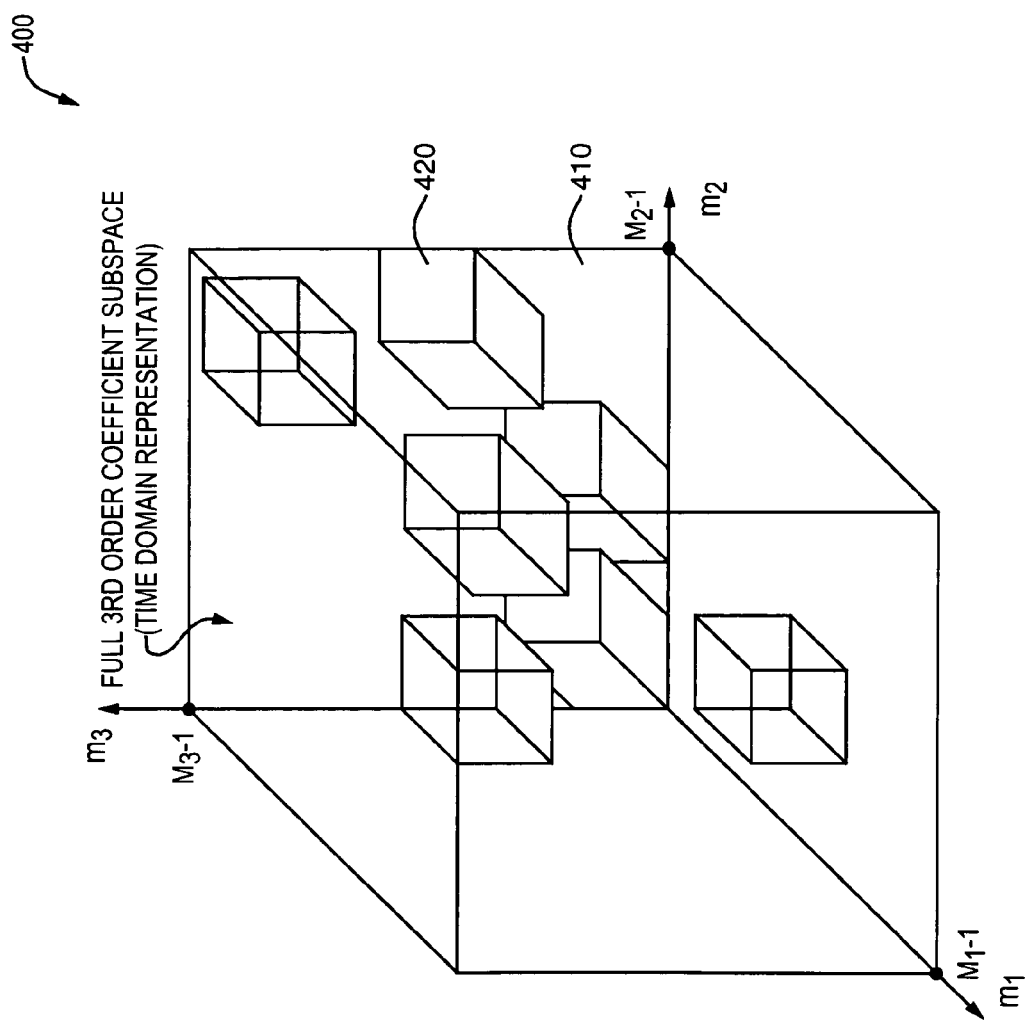
FIG. 4 is a the graphical illustration of the geometry of a combined CCS and CCS-D systems.

FIG. 4 is a graphical illustration of an example combined CCS and diagonal cube coordinate subspace (CCS-D) system. Diagonal swaths are cut from the full coefficient space using the following formulation:

$$y_5(n) = \sum_{m_1=delay_1}^{delay_1+memory} \sum_{m_2=delay_2}^{delay_2+memory} \sum_{m_3=delay_3}^{delay_3+memory} h(m_1, m_2, m_3, \alpha_4)x(n-m_1)$$
$$x(n-m_1-m_2)x^*(n-m_1-m_3)x(n-m_1-\alpha_4)x^*(n-m_1-\alpha_5)$$

which is referred to as a diagonal cube coefficient subspace, with the above formulation representing a fifth order polynomial.

CCS-D components consist of small parallelepipeds 420 of arbitrary dimension that lie along the diagonals within the full kernel. Similar to the full CCS, CCS-D component sets also allow efficient adaptation in multiple dimensions. Candidate component sets containing CCS and CCS-D components yield the most flexibility and the best results.

Figure 5A:
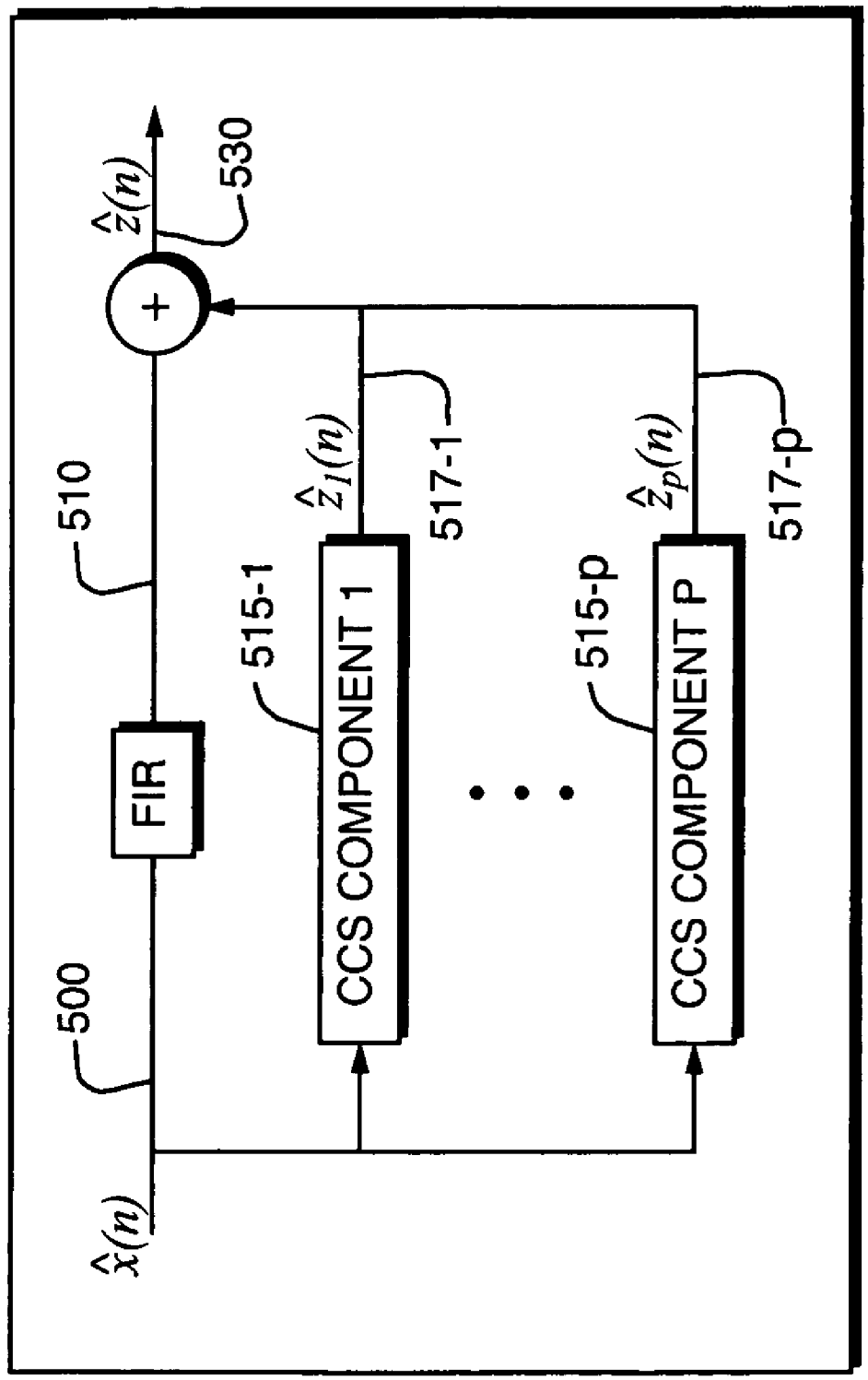
FIG. 5A is an example illustration of a CCS hardware implementation.

FIG. 5A is an illustration of an example embodiment of a CCS implementation. An input signal $\hat{x}(n)$ 500 to the predistorter enters a finite impulse response (FIR) filter 510. The FIR filter 510 is employed to filter the input signal 500. This example embodiment employs the vector of multi-dimensional coefficients 515-1-515-P to create the predistorted input signal. Specifically, the representation of predistorted signal $\hat{z}(n)$ 530 is described as the sum of the outputs $\hat{z}_1(n)$ (517-1) to $\hat{z}_p(n)$ (517-P) of CCS component 1 (515-1) through CCS component P (515-P), in addition to the output of the FIR filter (510).

Breaking up a Volterra series representation into CCS and CCS-D components has two advantages. First, breaking up the Volterra series enables the localization of nonlinearities using small segments of the full Volterra kernel to dramatically improve computational efficiency. Additionally, each d-dimensional CCS and CCS-D component can be used in algorithms that allow for immediate adaptation in d dimensions, while using multiple CCS and CCS-D components allows for adapting coefficients in an arbitrary number of dimensions.

The representation of the response of the power amplifier or the predistorter may be obtained using a variety of multi-dimensional coefficient spaces such as a Volterra Series. In this example embodiment, the representation of the response $\hat{z}(n)$ 530 is described as a function of summation of individual responses to each of the CCS components (i.e., $\hat{z}_1(n)$ 517-1 through $\hat{z}_p(n)$ 517-P).

Figure 5B:
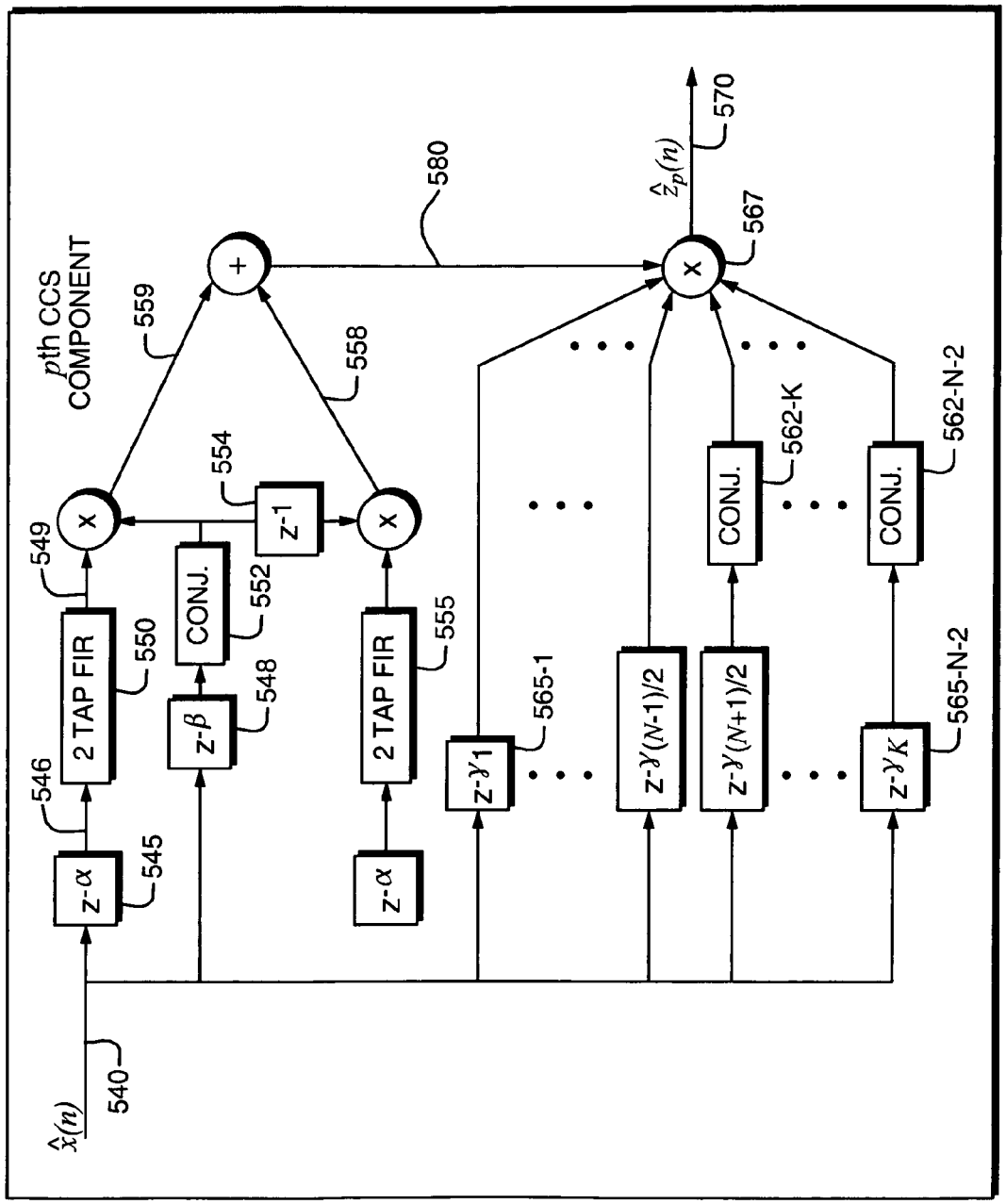
FIG. 5B is an example illustration of a CCS nonlinear filter.

FIG. 5B is an example illustration of a CCS nonlinear filter for an example CCS component P (515-P). In the present example, the CCS component 515-P consists of a small hypercube of dimension 2 within the full Nth-order kernel. In this embodiment, the input signal to the power amplifier $\hat{x}(n)$ 540 is introduced to a delay 545 of $\alpha$. The resulting signal 546 enters a first two-tap FIR filter 550, and a second two-tap FIR filter 555. The input $\hat{x}(n)$ 540 is also introduced to a conjugated 552 delay element $z^{-\beta}$ 548.

The output signal 549 from the first two-tap filter 550 is then multiplied by the signal delayed by delay element $z^{-\beta}$ 548 resulting in an output signal 559. The signal delayed by delay element $z^{-\beta}$ 548 is also further delayed by delay element $z^{-1}$ 557 and multiplied by the output signal 556 of the second two-tap filter 555, resulting in an output signal 558. The resulting signals 558, 559 are then summed to create a signal 580.

The signal 540 is also introduced to N−2 delay elements $z^{\gamma_1}$ through $z^{\gamma_{N-2}}$, K=(N−3)/2 of which are followed by conjugators 562-K to 562-N-2. The product of the output signals from these delay elements are multiplied by the signal 580 obtained from summing the resulting signals from the delay elements and two-tap filters. A signal 570 resulting from this multiplication represents the individual response to the P-th CCS component.

Figure 6A:
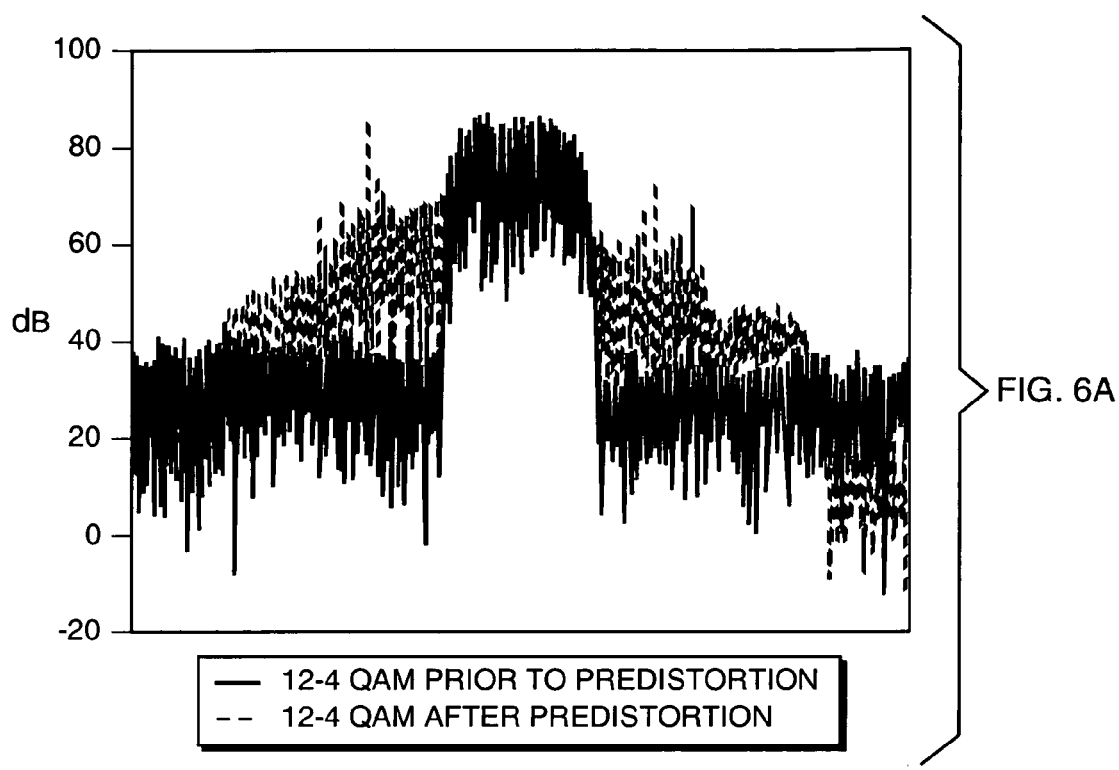
FIG. 6A illustrates transmission performance of the CCS system digital baseband predistortion.
Figure 6B:
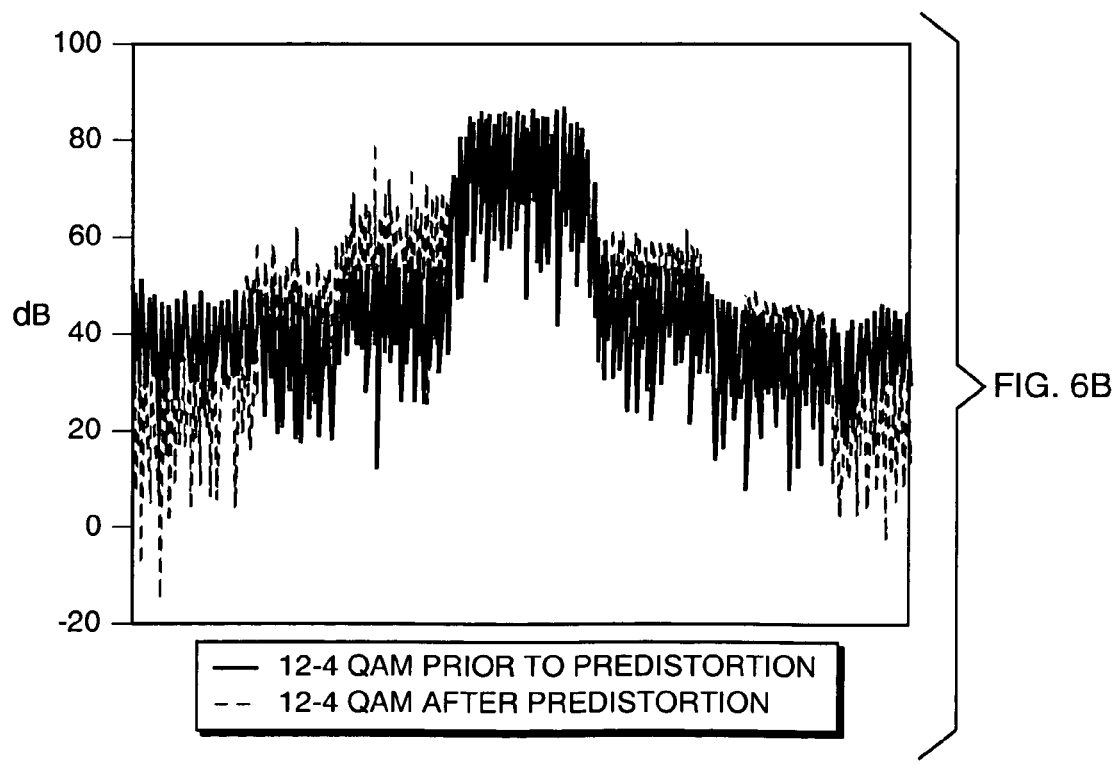
FIG. 6B illustrates transmission performance of the digital baseband predistortion that employs a commercial lookup table.

FIG. 6A illustrates the transmission performance of the CCS digital baseband predistortion. The measurements demonstrated roughly 25 dB suppression of adjacent channel interference. As shown in FIG. 6A, CCS digital baseband predistortion was able to improve spectral regrowth to pack channels more tightly and improve spectral efficiency by a factor of more than two. The power amplifier power efficiency has also been improved and the overall performance of CCS digital baseband predistortion significantly outperforms the commercially available tool that operates based on lookup tables. In contrast, the prior art lookup table approach, as shown in FIG. 6B, was never able to achieve the same level of linearization as CCS.

Lookup tables have low computational complexity, but are poorly suited for addressing memory effects in wideband power amplifiers. Volterra implementations have good performance but at an extremely high computational cost. CCS implementations are less complex than Volterra and more complex than lookup tables but have both good performance and a regularized structure for efficient hardware implementation.

While this invention has been particularly shown and described with references to example embodiments thereof, it will be understood by those skilled in the art that various changes in form and details may be made therein without departing from the scope of the invention encompassed by the appended claims.

What is claimed is:

1. A method for linearizing a response of a wideband power amplifier, comprising:
   detecting the response of the wideband power amplifier;
   representing the response using a set of coefficients in a multi-dimensional coefficient space; and
   linearizing the response as a function of a vector of multi-dimensional coefficient subspace components identified from the set of coefficients in the multi-dimensional coefficient space according to an optimization criterion.

2. The method of claim 1 comprising representing the response as a Volterra Series.

3. The method of claim 1 wherein representing the response comprises using components that span hypercubic regions in the multi-dimensional coefficient subspace.

4. The method of claim 1 wherein the multi-dimensional coefficient subspace components are cube coefficient subspaces or diagonal cube coordinate subspaces.

5. The method of claim 1 wherein the optimization criterion comprises summation of one or more optimization criteria.

6. The method of claim 5 wherein one or more optimization criteria comprise a regularization term equal to a sum of norms of coefficients of each cube coefficient subspace component.

7. The method of claim 5 wherein one or more optimization criteria comprise a norm of a difference between observed and estimated data.

8. The method of claim 7 wherein the observed data comprises a vector of input voltage levels from the power amplifier.

9. The method of claim 7 wherein the estimated data comprises a product of a kernel matrix and a cube coefficient subspace vector.

10. The method of claim 9 wherein the kernel matrix comprises nonlinear combinations of voltage levels observed from digitizing an output of the power amplifier based on a predetermined vector of input voltage levels to the power amplifier.

11. A method as in claim 1 additionally comprising applying the vector of multi-dimensional subspace coefficients arranged to nonlinearly filter the input to feed to the power amplifier as a nonlinear digital baseband pre-distortion filter.

12. The method of claim 1 wherein representing the response comprises using components that span parallelepiped regions in the multi-dimensional coefficient subspace.

13. An apparatus for linearizing a response of a power amplifier comprising:
   a detector for detecting the response of the power amplifier; and a processor for (a) representing the response using a set of coefficients in a multi-dimensional space; and (b) linearizing the response as a function of a vector of multi-dimensional components identified from the set of coefficients in the multi-dimensional coefficient space according to an optimization criterion.

14. The apparatus of claim 13 comprising representation of the response as a Volterra Series.

15. The apparatus of claim 13 wherein the response is represented using components that span hypercubic regions in the multi-dimensional subspace.

16. The apparatus of claim 13 wherein the multi-dimensional subspace system are cube coefficient subspaces or diagonal cube coordinate subspaces.

17. The apparatus of claim 13 wherein the optimization criterion comprises summation of one or more optimization criteria.

18. The apparatus of claim 17 wherein one or more optimization criteria comprise a regularization term equal to a sum of norms of coefficients of each cube coefficient subspace component.

19. The apparatus of claim 17 wherein one or more optimization criteria comprise a norm of the difference between observed and estimated data.

20. The apparatus of claim 19 wherein the observed data comprises a vector of input voltage levels from the power amplifier.

21. The apparatus of claim 19 wherein the estimated data comprises a product of a Kernel matrix and a cube coefficient subspace vector.

22. The apparatus of claim 21 wherein the kernel matrix comprises nonlinear combinations of voltage levels observed from digitizing an output of the power amplifier based on a predetermined vector of input voltage levels to the power amplifier.

23. The apparatus of claim 13 additionally comprising a pre-distortion filter, including multi-dimensional subspace coefficients arranged to nonlinearly filter the input to feed to the power amplifier.

24. The apparatus of claim 13 wherein the response is represented using components that span parallelepiped regions in the multi-dimensional subspace.

* * * * *